(12) United States Patent
Kang

(10) Patent No.: US 6,882,216 B2
(45) Date of Patent: Apr. 19, 2005

(54) ON-CHIP HIGH-PASS FILTER WITH LARGE TIME CONSTANT

(75) Inventor: Han-Chang Kang, Taipei Hsien (TW)

(73) Assignee: Realtek Semiconductor Corp., Hsin Chu (TW)

( * ) Notice: Subject to any disclaimer, the term of this patent is extended or adjusted under 35 U.S.C. 154(b) by 0 days.

(21) Appl. No.: 10/604,037

(22) Filed: Jun. 24, 2003

(65) Prior Publication Data

US 2004/0263211 A1 Dec. 30, 2004

(51) Int. Cl.$^7$ ................................................. H03K 5/00
(52) U.S. Cl. ..................................... 327/552; 327/559
(58) Field of Search ......................... 327/311, 552–559, 327/321

(56) References Cited

U.S. PATENT DOCUMENTS

| 4,924,115 A | * | 5/1990 | Yazdy | ........................ 326/25 |
| 5,999,043 A | * | 12/1999 | Zhang et al. | ................ 327/558 |
| 6,091,289 A | * | 7/2000 | Song et al. | .................. 327/558 |
| 6,437,639 B1 | * | 8/2002 | Nguyen et al. | ............. 327/558 |
| 6,559,715 B1 | * | 5/2003 | Frake et al. | ................. 327/558 |

* cited by examiner

Primary Examiner—Dinh T. Le
(74) Attorney, Agent, or Firm—Winston Hsu

(57) ABSTRACT

An on-chip high-pass filter with large time constant comprising a capacitor, a first transistor having a first terminal connected to a first voltage source and a second terminal connected to the capacitor, and a second transistor having a first terminal connected to the second terminal of the first transistor and a second terminal connected to ground, wherein the first transistor and the second transistor are for operating as a large-resistance resistor. The electrical equivalent large-resistance resistor and the capacitor together form a high-pass filter between the input port and the output port.

8 Claims, 7 Drawing Sheets

ON-CHIP HIGH-PASS FILTER WITH LARGE TIME CONSTANT

BACKGROUND OF INVENTION

1. Field of the Invention

The invention relates to a high-pass filter, and more particularly, to an on-chip high-pass filter with a large time constant.

2. Description of the Prior Art

In order to remove the DC component of a signal or to eliminate the DC offset, many circuits call for the use of a high-pass filter. A DC voltage blocking capacitor, DC voltage level shifter, and DC servo loop are all the example circuits implemented as high-pass filters.

In a device using two separate supply voltages, it may not be possible to directly connect signals from one power supply domain to another due to different DC voltage levels. In order to connect signals between the two domains, a DC voltage level shifter can be used to shift the voltage from the first domain to that of the second domain. However, due to improvements in the IC and device fabrication process, the on-chip working voltage has been greatly reduced and is actually too low for a DC voltage level shifter to meet its original performance requirements. In this situation, a high-pass filter can be used to block the DC voltage but still pass the desired signal. If the corner frequency of the high-pass filter is low enough, there will be no adverse effect on the system by using a high-pass filter.

DC offset voltage is always a concern when implementing zero intermediate frequency (IF) receivers, mixers, and low pass filters. If not removed, this unwanted DC offset voltage could saturate sensitive devices, such as ADC converters, causing them to malfunction. A normal solution to this problem is to add a DC servo loop. A DC servo circuit uses feedback to hold the output DC voltage level constant, however, the smaller the feedback window is (meaning a very low corner frequency), the longer the settling time will be. When the corner frequency is very low, not only are the resistance of the resistor and the capacitance of the capacitor of the required filter very large but also the settling time is often too long. By using a simple high-pass filter, the same function as a DC servo circuit can be achieved without the added problem of the closed loop settling time being too long.

FIG. 1 shows a conventional high-pass filter 10. A capacitor 12 is connected between an input port 14 and an output port 16 and a resistor 18 is connected between the output port 16 and ground. When using the standard resistor/capacitor (RC) high-pass filter 10 shown in FIG. 1, a resistor with large resistance 18 and a capacitor with large capacitance 12 must be used in order to produce the desired low corner frequency. If the corner frequency is specified to be 100 Hz (or lower), the resistance of the resistor 18 must be in the order of Mohms and the capacitance of the capacitor 12 will approach the hundred pF range. For example, if the desired corner frequency (Fc) is 100 Hz, using the formula $Fc=1/(2\pi R \cdot C)$, the capacitance of the capacitor 12 is 50 pF and the resistance of the resistor 18 must be 33 Mohm. These large-magnitude resistors and capacitors are very difficult to implement on an IC without using extremely large amounts of IC space. The space required by the high-pass filter 10 could actually be several times the space of the rest of the design.

SUMMARY OF INVENTION

It is therefore a primary objective of the claimed invention to provide an on-chip high-pass filter having a low corner frequency and a large time constant to solve the above-mentioned problem.

According to the claimed invention, an on-chip high-pass filter with large time constant comprising a capacitor, a first transistor having a first terminal connected to a first voltage source and a second terminal connected to the capacitor, and a second transistor having a first terminal connected to the second terminal of the first transistor and a second terminal connected to ground, wherein the first transistor and the second transistor are for operating as a large-resistance resistor. The electrical equivalent large-resistance resistor and the capacitor together form a high-pass filter between the input port and the output port.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
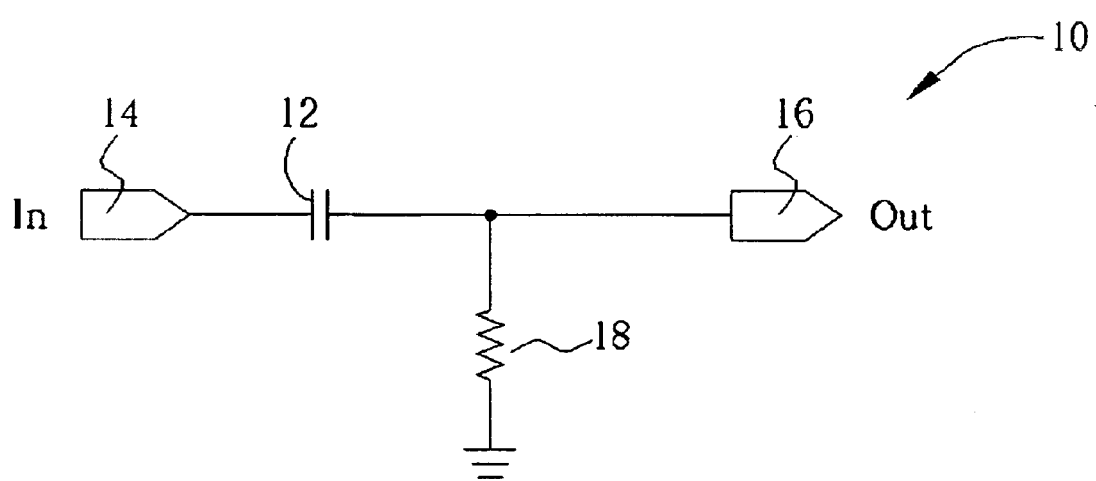
FIG. 1 is a schematic diagram of a high-pass filter according to the prior art.
Figure 2:
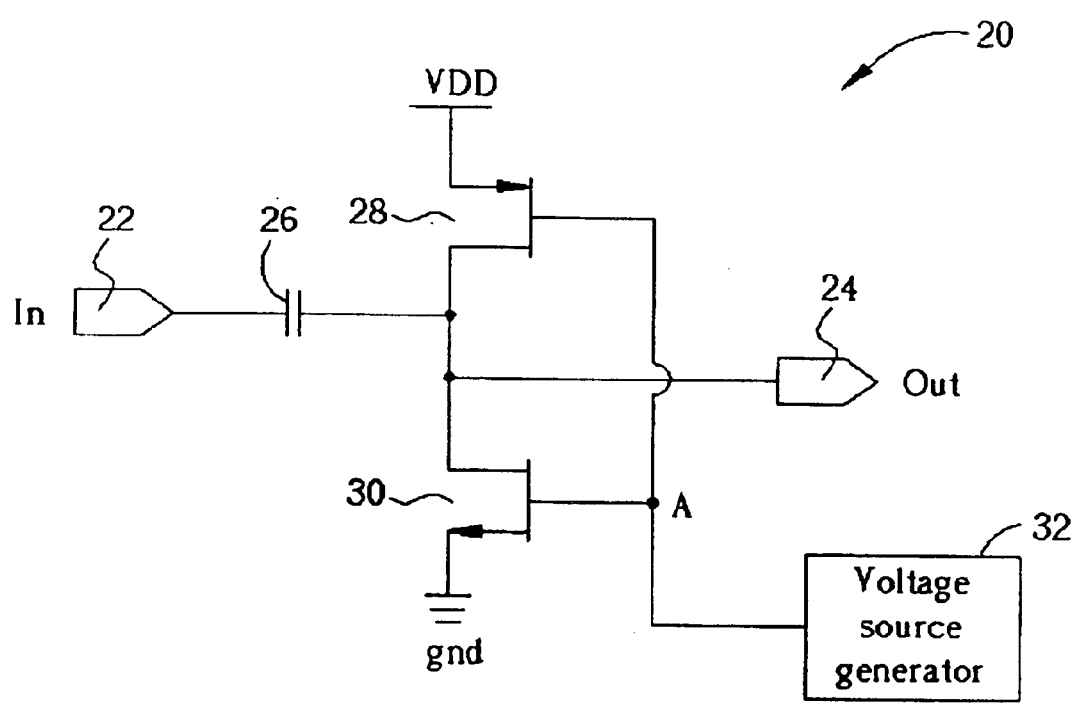
FIG. 2 is a schematic diagram of a high-pass filter according to the present invention.

Please refer to FIG. 2 showing a schematic diagram of a high-pass filter 20 according the embodiment of the present invention. The high-pass filter 20 comprises an input port 22, an output port 24, a capacitor 26, a p-type transistor 28, an n-type transistor 30, and a voltage source generator 32. The capacitor 26 is connected between the input port 22 and the output port 24. The p-type transistor 28 has its source terminal connected to a supply voltage VDD and its drain terminal connected to the output port 24. The n-type transistor 30 has its drain terminal connected the output terminal 24 and its source terminal connected to ground. The gate terminals of both the p-type transistor 28 and n-type transistors 30 are connected to the output of the voltage source generator 32. The voltage source generator 32 is for providing a voltage level such that both the p-type transistor and the n-type transistor can be operated in a saturation mode.

The magnitude of the drain current of a transistor is determined by deciding the length (L) and the width (W) of the channel during the manufacturing process. When the transistor operates in the saturation mode, the magnitude of the drain current $I_D$ is constant after the length (L) and the width (W) of the channel are decided. However, in practical circuits, the magnitude of the drain current $I_D$ is slightly changed by changing the magnitude of the drain-to-source voltage $V_{DS}$ because of the channel length modulation effect. The output resistor $R_O$ of the transistor is $1/(I_D \cdot \lambda)$ regardless of the magnitude of $I_D$, wherein the Parameter $\lambda$ is relating to the linear dependence of drain current on drain-source voltage in the saturation region. $V_{DS}=1/\lambda$, which is called the early voltage. Therefore, if the transistor is operated in the saturation mode, it can be regarded as a resistor whose resistance is determined by the drain voltage $I_D$ Since both the p-type transistor and the n-type transistor together can be electrically equivalent to a resistor, the equivalent resistor and the capacitor 26 together form a high-pass filter between the input port 22 and the output port 24.

The typical magnitude range of $\hat{l}<<$ is between 0.01 and 0.03 $V^{-1}$, and that of the drain current ID is between uA~mA. In this manner, the output resistor $R_O$ can be hundreds of Mohms. It is therefore easy to implement an on-chip high-pass filter with a large time constant by operating the transistors to be a large-resistance resistor.

It should also be noted that although MOS transistors are used throughout the detailed description of the preferred embodiment, this is for example only and BJT transistors are also supported by the present invention.

The resistance of the output resistance formed by the p-type transistor 28 and the n-type transistor 30 is very sensitive to the voltage level of the gate terminal, which is produced by the voltage source generator 32. In theory, if there were no process variations between IC fabrications, the voltage source generator 32 would generate the same exact voltage signal regardless of fabrication and the resistance value and associated high-pass filter 20 corner frequency would be the same value for all ICs. In practice, there are always slight process variations in the transistor parameter values between IC fabrications and therefore the voltage source generator 32 must account for these variations in order to ensure a predictable resistance value is formed across all IC fabrications.

Figure 3:
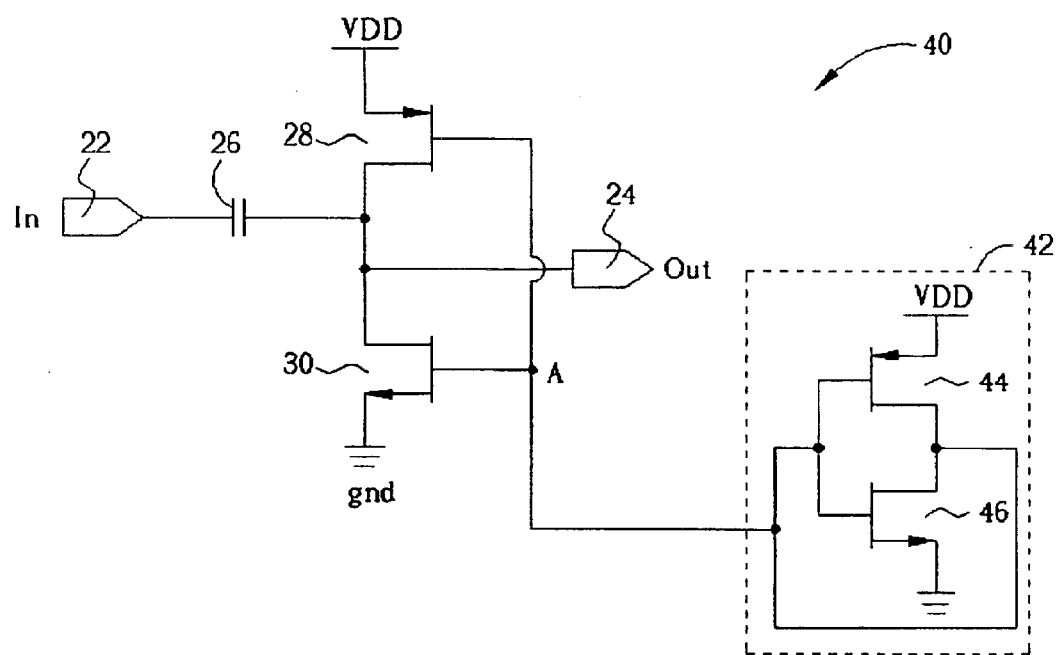
FIG. 3 is a schematic diagram of the high-pass filter of FIG. 2 with a bias replica voltage generator.

Please refer to FIG. 3 showing a schematic diagram of a high-pass filter 40 with a bias replica voltage generator 42. The bias replica voltage generator 42 comprises a p-type generator transistor 44 of substantially the same size as the p-type transistor 28 and an n-type generator transistor 46 of substantially the same size as the n-type transistor 30. The p-type generator transistor 44 has its source terminal connected to the supply voltage VDD and its drain terminal connected to the voltage source node A. The n-type generator transistor 46 has its drain terminal connected the voltage source node A and its source terminal connected to ground. The gate terminals of both the p-type and n-type generator transistors 44, 46 are also connected to the voltage source node A.

Because the sizes and layout of the p-type and n-type generator transistors 44, 46 are the same as the p-type and n-type transistor 28, 30 of the high-pass filter 40, the voltage signal generated at the voltage source node A by the bias replica voltage source generator 42 will account for the process variations between different IC fabrications. By adjusting the length (L) and the width (W) of the transistor channel for both the p-type and n-type transistors 28, 30 and choosing an appropriate sized capacitor 26, the time constant and corner frequency formed by the high-pass filter 40 can be directly controlled. The bias replica voltage source generator 42 ensures that each physical version of the circuit has the same corner frequency response regardless of process variations.

Figure 4:
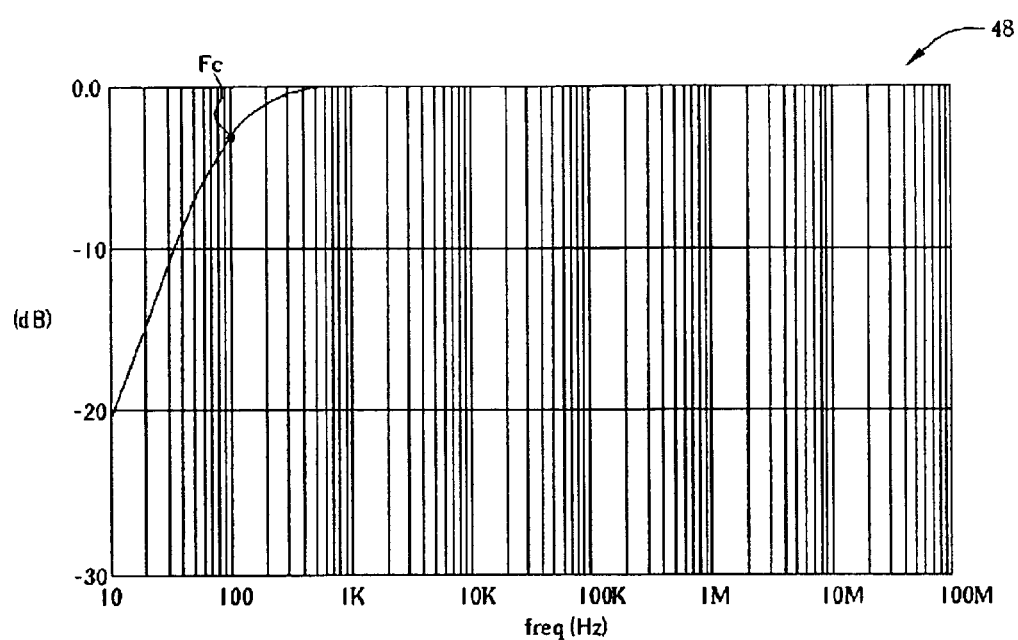
FIG. 4 is a graph of the frequency response for an example high-pass filter of FIG. 3.

Please refer to FIG. 4 showing a graph of the frequency response 48 for an example high-pass filter 40 according to the present invention. As seen in FIG. 4, by using W=2 Î ¼ m, L=20 Î ¼ m for the p-type transistors 28, 44; W=1 Î ¼ m, L=20 Î ¼ m for the n-type transistors 30, 46; and choosing C=13 pF for the capacitor 26, the corner frequency Fc of the high-pass filter will be 100 Hz. This high-pass filter 40 circuit is much easier to implement on an IC and results in a more space efficient layout when compared to the prior art.

Figure 5:
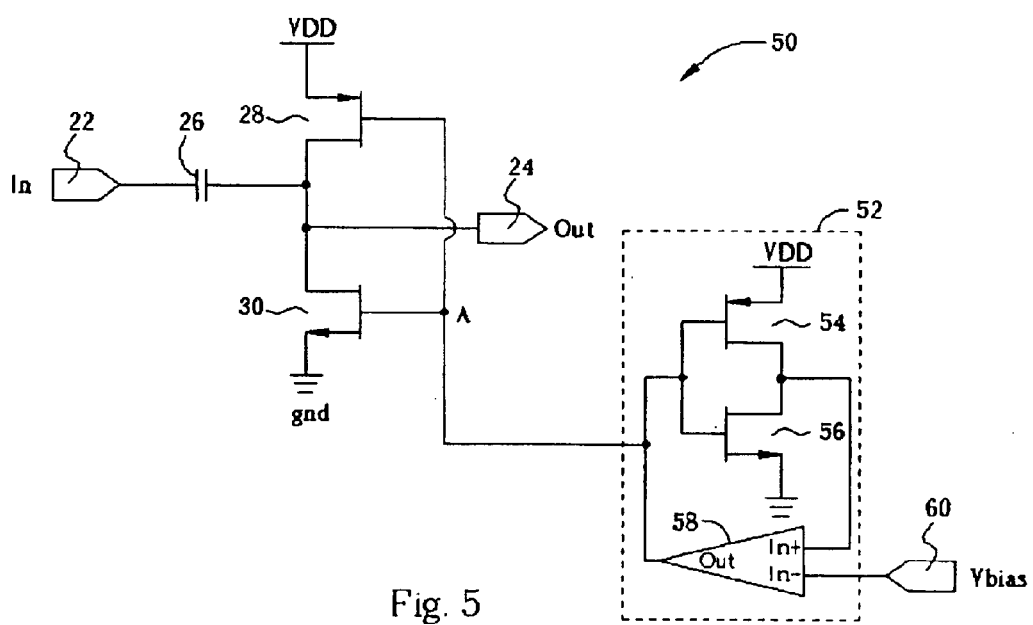
FIG. 5 is a schematic diagram of the high-pass filter of FIG. 2 with a variable bias replica voltage generator.

Please refer to FIG. 5 showing a schematic diagram of a high-pass filter 50 with a variable bias replica voltage generator 52. The variable bias replica voltage generator 52 comprises a p-type generator transistor 54 of substantially the same size as the p-type transistor 28, an n-type generator transistor 56 of substantially the same size as the n-type transistor 30, and an amplifier 58 having a non-inverting input terminal, an inverting input terminal, and an output terminal. The p-type generator transistor 54 has its source terminal connected to the supply voltage VDD and its drain terminal connected to the non-inverting terminal of the amplifier 58. The n-type generator transistor 56 has its drain terminal connected the non-inverting terminal of the amplifier 58 and its source terminal connected to ground. The gate terminals of both the p-type and n-type generator transistors 54, 56 are also connected to the voltage source node A. A voltage signal Vbias is applied to the inverting terminal of the amplifier 58 and the output of the amplifier 58 is connected to the voltage source node A.

Similar to the bias replica voltage source generator 42 shown in FIG. 3, because the sizes and layout of the p-type and n-type generator transistors 54, 56 are the same as the p-type and n-type transistor 28, 30 of the high-pass filter 52, the voltage signal generated at the voltage source node A by the variable bias replica voltage source generator 52 will account for the process variations between different IC fabrications. By adjusting the length (L) and the width (W) of the transistor channel for both the p-type and n-type transistor 28, 30 and choosing an appropriate sized capacitor 26, the time constant and corner frequency formed by the high-pass filter 50 can be directly controlled. The same values of W=2 Î ¼ m, L=20 Î ¼ m for the p-type transistors 28, 54; W=1 Î ¼ m, L=20 Î ¼ m for the n-type transistors 30, 56; and C=13 pF for the capacitor 26 will result in a corner frequency of 100 Hz and will produce the same frequency response as that shown in FIG. 4. The added advantage of the variable bias replica voltage source generator is that the DC offset of the high-pass filter 50 output port 24 will track the voltage signal Vbias input at the inverting terminal 60 of the amplifier 58. The variable bias replica voltage source generator 52 allows direct control of the high-pass filter 50 DC offset. The voltage signal Vbias has an acceptable range shown by the formula: Vt<Vbias< (VDDVt). The voltage gain of the amplifier 58 should be high enough to provide the desired accuracy for the output DC offset error. The higher the voltage gain of the amplifier 58, the lower the DC offset error seen at the high-pass filter 50 output port 24.

Figure 6:
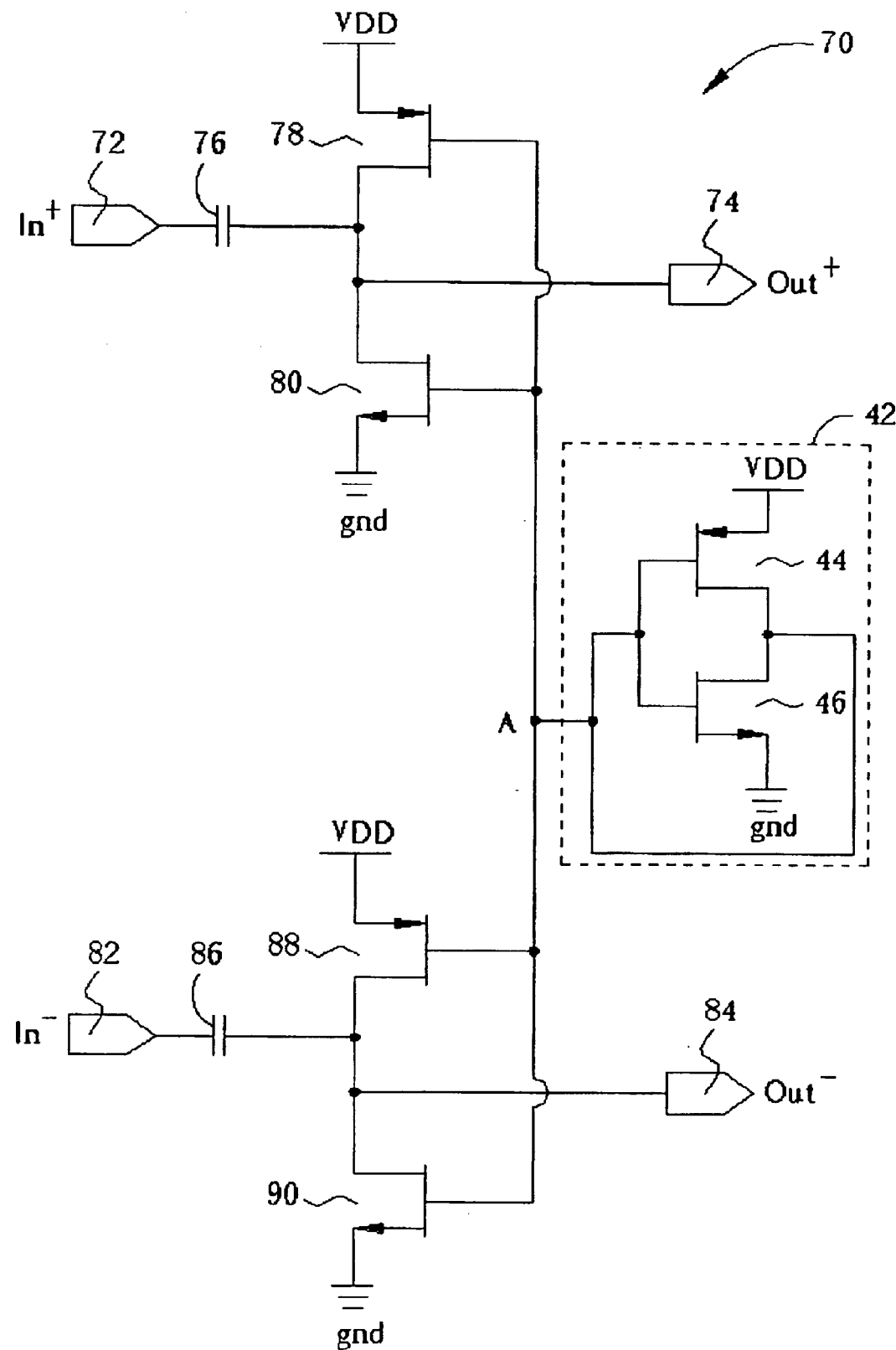
FIG. 6 is a schematic diagram of a differential version of the high-pass filter of FIG. 3.

Please refer to FIG. 6 showing a schematic diagram of a differential version of the high-pass filter 70 with the bias replica voltage source generator 42. The differential implementation, which is normally used in high-speed integrated circuit environments, has much greater common-mode noise rejection. The differential high-pass filter 70 with the bias replica voltage source generator 42 comprises a positive side input port 72, a positive side output port 74, a positive side capacitor 76, a positive side p-type transistor 78, a positive side n-type transistor 80, a negative side input port 82, a negative side output port 84, a negative side capacitor 86 of substantially the same value as the positive side capacitor 76, a negative side p-type transistor 88 of substantially the same size as the positive side p-type transistor 78, a negative side n-type transistor 90 of substantially the same size as the positive side n-type transistor 80, and the bias replica voltage source generator 42. The bias replica voltage source generator 42 comprises the same parts and has the same operation as shown in FIG. 3. The positive side capacitor 76 is connected between the positive side input port 72 and the positive side output port 74. The negative side capacitor 86 is connected between the negative side input port 82 and the negative side output port 84. The positive side p-type transistor 78 has its source terminal connected to the supply voltage VDD and its drain terminal connected to the positive side output port 74 and the positive side n-type transistor 80 has its drain terminal connected the positive side output port 74 and its source terminal connected to ground. The negative side p-type transistor 88 has its source terminal connected to the supply voltage VDD and its drain terminal connected to the side output port 84 and the negative side n-type transistor 90 has its drain terminal connected the negative side output port 84 and its source terminal connected to ground. The gate terminals of the positive and negative side p-type and n-type transistors 78, 80, 88, 90 are all connected to the voltage source node A, which is connected to the output of the bias replica voltage source generator 42.

The operation of the differential high-pass filter 70 is very similar to the single ended version shown in FIG. 3 except in FIG. 6 the positive side high-pass filter is duplicated to provide a negative side high-pass filter needed for differential implementation. The circuit operation of each side (positive and negative) is the same as the high-pass filter shown in FIG. 3.

Figure 7:
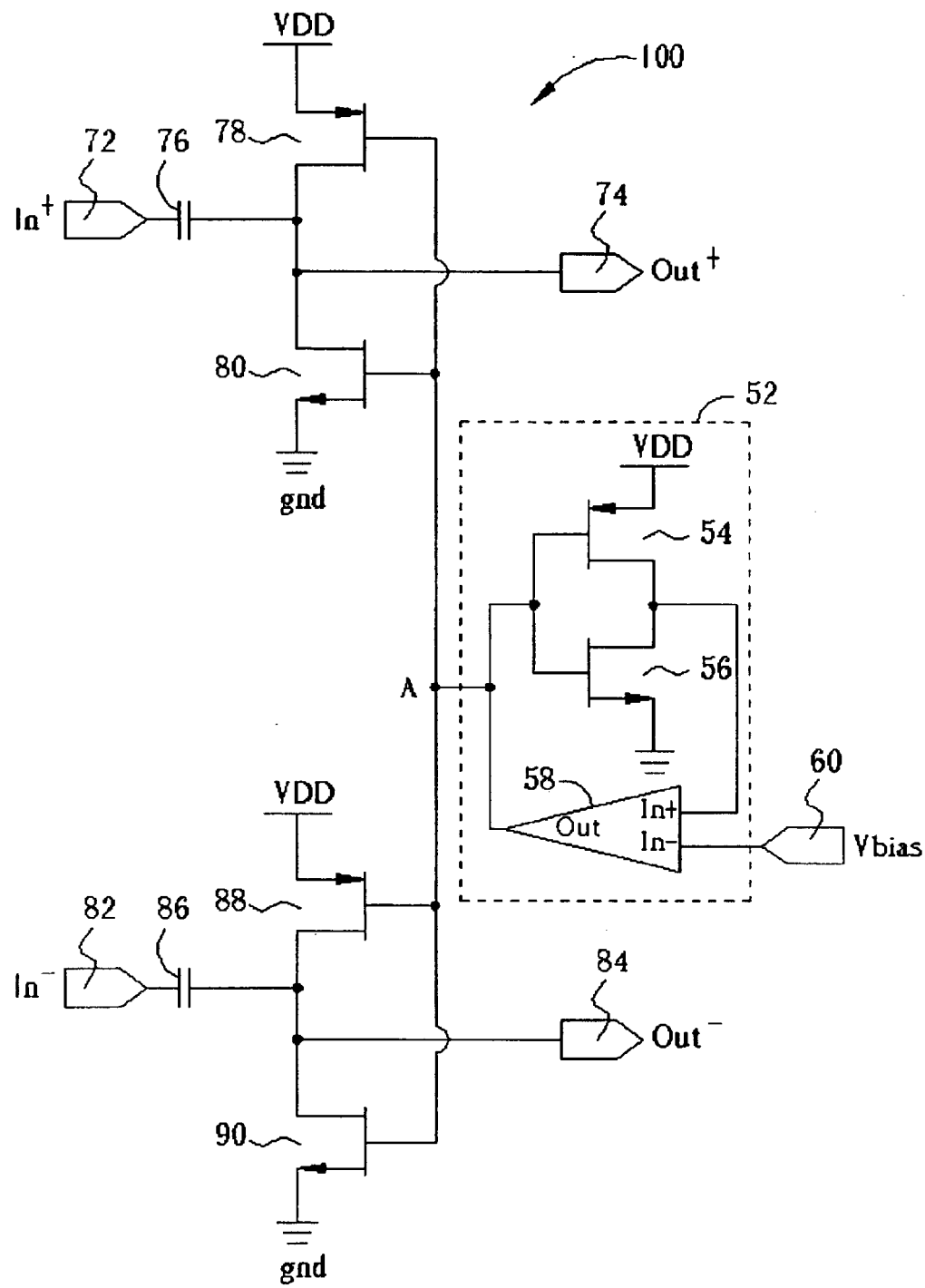
FIG. 7 is a schematic diagram of a differential version of the high-pass filter of FIG. 5.

Please refer to FIG. 7 showing a schematic diagram of a differential high-pass filter 100 with the variable bias replica voltage source generator 52. The differential high-pass filter 100 using the variable bias replica voltage source generator 52 can be used for situations where the DC voltage offset of the positive and negative side output ports 74, 84 needs to be controlled. The circuit schematic is very similar to the differential high-pass filter 70 shown in FIG. 6 except the voltage signal at the voltage source node A is generated by the variable bias replica voltage source generator 52. The circuit operation and parts of each side (positive and negative) high-pass filter is the same as shown in FIG. 6. The circuit operation and parts of the variable bias replica voltage source generator 52 is the same as that shown in FIG. 5.

In contrast to the conventional art, the present invention uses a p-type transistor and an n-type transistor together to form a predetermined resistance value so that a high-pass filter with a low corner frequency can be implemented on an IC. The predetermined resistance value and a capacitor together form a high-pass filter from an input port to an output port so that no resistor needs to be fabricated on the IC and a much smaller capacitor value can be used while still maintaining a low corner frequency of the high-pass filter. By using the bias replica voltage source generator according to the present invention, a predictable resistance value is formed by the p-type and n-type transistors regardless of process variations between IC fabrications. By using the variable bias replica voltage source generator according to the present invention, the DC voltage offset at the output port of the high-pass filter can also be directly controlled in addition to maintaining a predictable resistance value regardless of process variations between IC fabrications.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A high pass filter, comprising:
   a capacitor connected between an input port and an output port;
   a first transistor having a first terminal connected to a first voltage source and a second terminal connected to the output port;
   a second transistor having a first terminal connected to the second terminal of the first transistor and a second terminal connected to ground; and
   a second voltage source coupled to a third terminal of the first transistor and the second transistor such that the first and the second transistors are operated as a large-resistance resistor, the second voltage source comprising:
      a third transistor having a first terminal connected to the first voltage source, a second terminal connected to the third terminal of the first and the second transistor, and a third terminal connected to the second terminal thereof; and
      a four transistor having a first terminal connected to the second terminal of the first transistor, a second terminal connected to ground, and a third terminal connected to the first terminal thereof.

2. The high-pass filter of claim 1, wherein the first transistor is an n-type transistor.

3. The high-pass filter of claim 1, wherein the second transistor is a p-type transistor.

4. The high-pass filter of claim 1, wherein the first and the second transistors are operated in a saturation mode.

5. A high-pass filter, comprising:
   a capacitor connected between an input port and an output port;
   a first transistor having a first terminal connected to a first voltage source and a second terminal connected to the output port;
   a second transistor having a first terminal connected to the second terminal of the first transistor and a second terminal connected to ground; and
   a second voltage source coupled to a third terminal of the first transistor and the second transistor such that the first and the second transistors are operated as a large-resistance resistor, the second voltage source comprising:
      a third transistor having a first terminal connected to the first voltage source, a second terminal, and a third terminal;
      a fourth transistor having a first terminal connected to the second terminal of the first transistor, a second terminal connected to ground, and a third terminal; and
      an amplifier having a first input terminal connected to the second terminal of the first transistor, a second input terminal connected to a bias voltage source, and an output terminal connected to the third terminal of the first, the second, the third, and the fourth transistor.

6. The high-pass filter of claim 5, wherein the first transistor is an n-type transistor.

7. The high-pass filter of claim 5, wherein the second transistor is a p-type transistor.

8. The high-pass filter of claim 5, wherein the first and the second transistors are operated in a saturation mode.

* * * * *